United States Patent
Shih et al.

(10) Patent No.: US 7,741,752 B2
(45) Date of Patent: Jun. 22, 2010

(54) HIGH FREQUENCY SURFACE ACOUSTIC WAVE DEVICE AND THE SUBSTRATE THEREOF

(75) Inventors: Wen-Ching Shih, Taipei (TW); Hui-Min Wang, Taipei (TW)

(73) Assignee: Tatung Company & Tatung University, Taipei (TW)

( * ) Notice: Subject to any disclaimer, the term of this patent is extended or adjusted under 35 U.S.C. 154(b) by 0 days.

(21) Appl. No.: 12/232,033

(22) Filed: Sep. 10, 2008

(65) Prior Publication Data
US 2010/0038991 A1 Feb. 18, 2010

(30) Foreign Application Priority Data
Aug. 12, 2008 (TW) .............................. 97130638 A

(51) Int. Cl.
*H03H 9/25* (2006.01)
(52) U.S. Cl. ................................ 310/313 R; 310/313 B
(58) Field of Classification Search ............. 310/313 A, 310/313 B, 313 C, 313 D, 313 R
See application file for complete search history.

(56) References Cited

U.S. PATENT DOCUMENTS 7,166,954 B2 * 1/2007 Miyazawa et al. .......... 310/358

2004/0197599 A1 * 10/2004 Higuchi et al. ............. 428/689
2005/0167715 A1 * 8/2005 Higuchi et al. ............. 257/295

FOREIGN PATENT DOCUMENTS

JP 2006-229937 A * 8/2006

* cited by examiner

*Primary Examiner*—Thomas M Dougherty
(74) *Attorney, Agent, or Firm*—Bacon & Thomas, PLLC

(57) ABSTRACT

A high frequency SAW device and the substrate thereof are disclosed. The disclosed high frequency SAW device does not need to use the conventional and expensive sapphire substrate as its substrate. Besides, the disclosed substrate for a high-frequency SAW device can replace the conventional sapphire substrate in the use of the substrate for a high frequency SAW device. The disclosed high frequency SAW device comprises: a substrate; a first buffering layer forming on the surface of the substrate; a second buffering layer forming on the surface of the first buffering layer; a piezoelectric layer forming on the surface of the second buffering layer; an input transformation unit; and an output transformation unit, wherein the input transformation unit and the output transformation unit are formed in pairs on the surface of or beneath the piezoelectric layer.

10 Claims, 6 Drawing Sheets

HIGH FREQUENCY SURFACE ACOUSTIC WAVE DEVICE AND THE SUBSTRATE THEREOF

BACKGROUND OF THE INVENTION

1. Field of the Invention

The present invention relates to a high frequency surface acoustic wave device and the substrate thereof and, more particularly, to a high frequency surface acoustic wave device, which does not require the conventional and expensive sapphire substrate as its substrate.

2. Description of Related Art

Please refer to FIG. 1A and FIG. 1B, wherein FIG. 1A is a perspective view of the conventional high frequency surface acoustic wave device and FIG. 1B is a cross-section view taken along the A-A' plane of FIG. 1A. As shown in FIG. 1A and FIG. 1B, the conventional high frequency surface acoustic wave device 1 comprises: a substrate 11; a piezoelectric layer 12 forming on the surface of the substrate 11; an input transformation unit 13; and an output transformation unit 14. The input transformation unit 13 and the output transformation unit 14 are formed in pairs on the surface of the piezoelectric layer 12. The input transformation unit 13 and the output transformation unit 14 are both interdigital electrodes, and thus an interdigital transducer is formed. Besides, in the conventional high frequency surface acoustic wave device 1, substrate 11 of the high frequency surface acoustic wave device 1 is a sapphire substrate. The piezoelectric layer 12 is a ZnO, AlN, LiNbO$_3$ or LiTaO$_3$ film, having the thickness preferably between 0.1 µm and 10 µm. Moreover, the input transformation unit 13 and the output transformation unit 14, which are formed in pairs on the surface of the piezoelectric layer 12, are made of aluminum, with their line width being between 0.1 µm and 5 µm.

However, since other opto-electronic applications, such as a light emitting diode, also require the sapphire substrate as the substrate thereof, the price of the sapphire substrate increases a lot, and the supply of the sapphire substrate to the market is not stable, either. As a result, by using the sapphire substrate as its substrate, the manufacturing cost of the conventional high frequency surface acoustic wave device cannot be lowered, and the manufacturing process may also be forced to halt, due to the sapphire substrate often becoming out of stock.

Therefore, a high frequency surface acoustic wave device that can remove the requirement of the expensive sapphire substrate as its substrate is required, for lowering the manufacturing cost of a high frequency surface acoustic wave device.

SUMMARY OF THE INVENTION

The object of the present invention is to provide a high frequency surface acoustic wave device to remove the requirement of the expensive sapphire substrate as its substrate, for lowering the manufacturing cost of a high frequency surface acoustic wave device.

To achieve the object, the high frequency surface acoustic wave device of the present invention comprises a substrate; a first buffering layer forming on the surface of the substrate; a second buffering layer forming on the surface of the first buffering layer; a piezoelectric layer forming on the surface of the second buffering layer; an input transformation unit; and an output transformation unit; wherein the input transformation unit and the output transformation unit are formed in pairs on the surface or beneath of the piezoelectric layer.

Therefore, by forming a first buffering layer (i.e. the silicon oxide layer) and a second buffering layer (i.e. the Al$_2$O$_3$ layer) sequentially on the surface of the silicon substrate, and then forming a piezoelectric layer on the second buffering layer (i.e. the Al$_2$O$_3$ layer), the substrate of the high frequency surface acoustic wave device of the present invention can have the structure similar to that of the substrate of the conventional high frequency surface acoustic wave device. Besides, the operation performance of the high frequency surface acoustic wave device of the present invention (for example, the network spectrum response and the acoustic velocity of the surface acoustic wave) is equal to that of the conventional frequency surface acoustic wave device. As a result, without using the expensive sapphire substrate as its substrate, the high frequency surface acoustic wave device of the present invention can still have equal or better operation performance than the conventional high frequency surface acoustic wave device. Therefore, the manufacturing cost of the high frequency surface acoustic wave device of the present invention can be lowered dramatically.

Moreover, as it is easier to grow a large-sized silicon substrate than to grow a large-sized sapphire substrate, such as the 12 inches silicon wafer, and most electronic devices can be formed on the silicon substrate, the manufacturing cost of the high frequency surface acoustic wave device of the present invention can be lowered effectively, and the high frequency surface acoustic wave device of the present invention can be integrated with other silicon-based electronic devices on the same silicon substrate.

The high frequency surface acoustic wave device of the present invention can have any kind of substrate, but the substrate is preferably a silicon substrate. The first buffering layer of the high frequency surface acoustic wave device of the present invention can be made of any kind of material, but the first buffering layer is preferably made of silicon oxide and the thickness thereof is preferably between 0.05 µm and 0.2 µm. The second buffering layer of the high frequency surface acoustic wave device of the present invention can be made of any kind of material, the second buffering layer is preferably made of aluminum oxide and the thickness thereof is preferably between 0.5 µm and 20 µm. The second buffering layer of the high frequency surface acoustic wave device of the present invention can be formed on the surface of the first buffering layer by any kind of manufacturing process, it is preferably formed by an electron-beam evaporation process or a radio frequency magnetron sputtering process. The piezoelectric layer of the high frequency surface acoustic wave device of the present invention can be any kind of piezoelectric film, but it is preferably a ZnO, AlN, LiNbO$_3$ or LiTaO$_3$ film. The input transformation unit and the output transformation unit of the high frequency surface acoustic wave device of the present invention can be made of any kind of material, but it is preferably made of aluminum.

Other objects, advantages, and novel features of the invention will become more apparent from the following detailed description when taken in conjunction with the accompanying drawings.

DETAILED DESCRIPTION OF THE PREFERRED EMBODIMENT

Figure 1A:
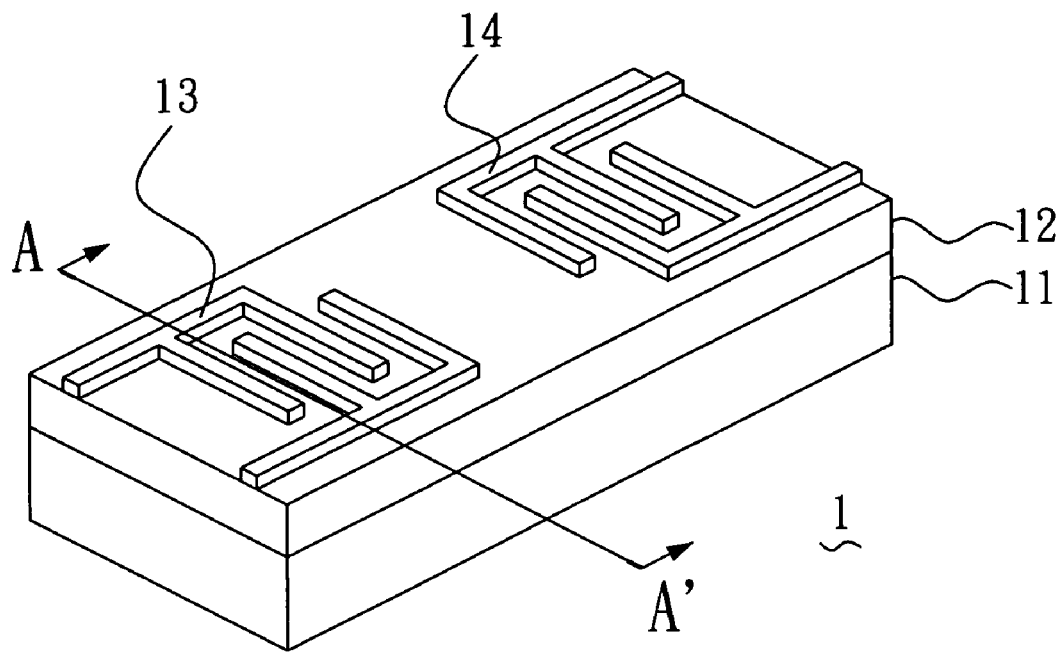
FIG. 1A is a perspective view of the conventional high frequency surface acoustic wave device.
Figure 1B:
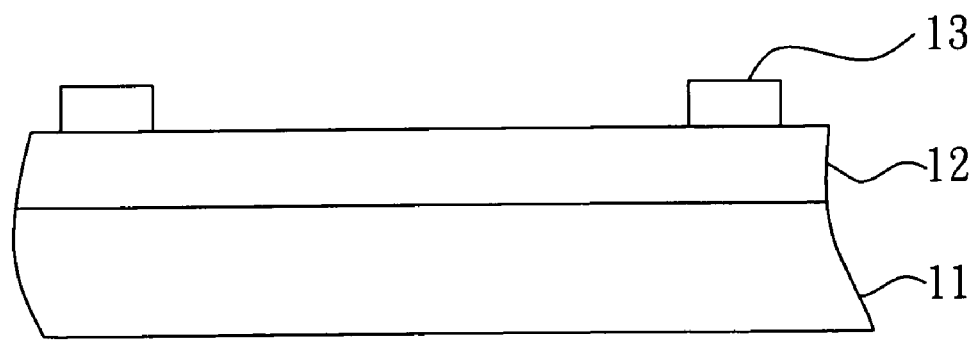
FIG. 1B is a cross-section view taken along the A-A' plane of FIG. 1A.
Figure 2A:
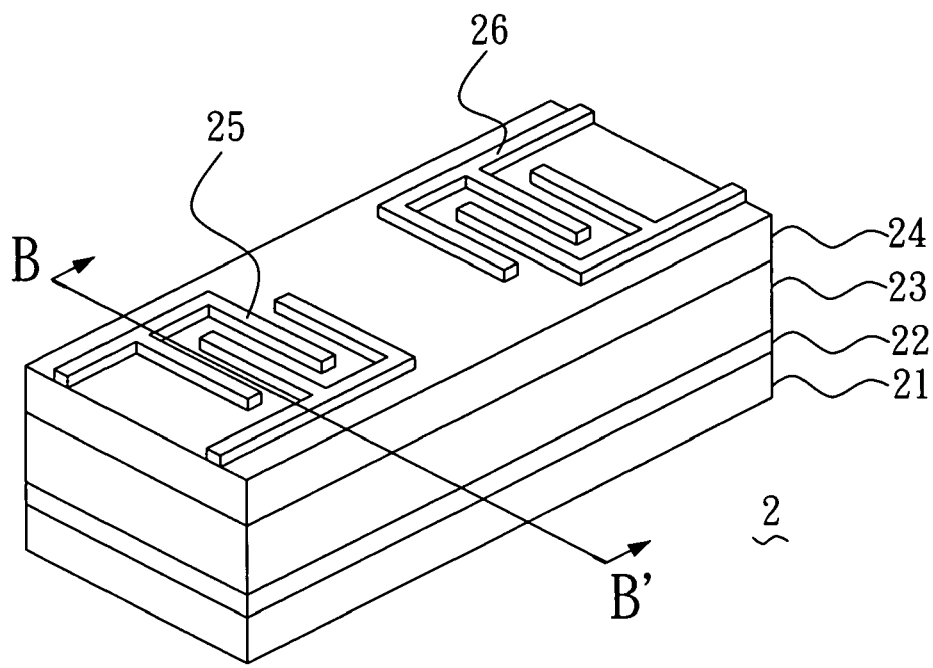
FIG. 2A is a perspective view of the high frequency surface acoustic wave device according to one embodiment of the present invention.
Figure 2B:
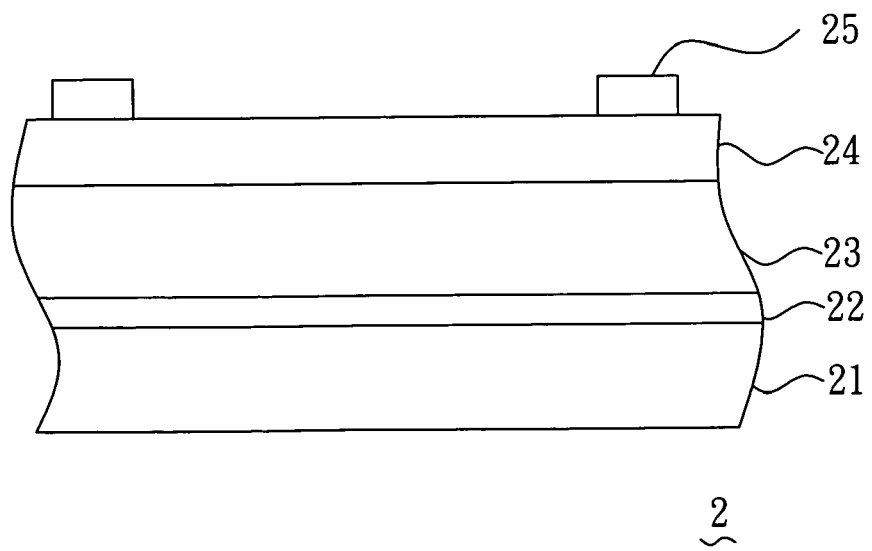
FIG. 2B is a cross-section view taken along the B-B' plane of FIG. 2A.

With reference to FIGS. 2A and 2B, wherein FIG. 2A is a perspective view of the high frequency surface acoustic wave device according to one embodiment of the present invention, and FIG. 2B is a cross-section view taken along the B-B' plane of FIG. 2A, the high frequency surface acoustic wave device 2 of the present invention comprises: a substrate 21; a first buffering layer 22 forming on the surface of the substrate 21; a second buffering layer 23 forming on the surface of the first buffering layer 22; a piezoelectric layer 24 forming on the surface of the second buffering layer 23; an input transformation unit 25; and an output transformation unit 26. The input transformation unit 25 and the output transformation unit 26 are formed in pairs on the surface of the piezoelectric layer 24. The input transformation unit 25 and the output transformation unit 26 are both interdigital electrodes, and thus an interdigital transducer is formed.

Besides, in the present embodiment, the substrate 21 of the high frequency surface acoustic wave device 2 is made of silicon (i.e. a silicon substrate). The first buffering layer 22 is made of silicon oxide, and the thickness thereof is preferably between 0.05 μm and 0.2 μm. Moreover, the second buffering layer 23 is made of aluminum oxide, and the thickness thereof is 8 μm. The second buffering layer 23 is formed on the surface of the first buffering layer 22 by an electron-beam evaporation process. It should be noted that the thickness of the second buffering layer 23 is not limited to the aforementioned value. The second buffering layer 23 may have any thickness between 0.5 μm and 20 μm, depending on the application of the high frequency surface acoustic wave device. The piezoelectric layer 24 formed on the surface of the second buffering layer 23 is made of $Al_2O_3$, and the thickness thereof is 1.2 μm. It should be noted that the constituting material and the thickness of the piezoelectric layer 24 are not limited to the aforementioned kind of material and value, respectively. The piezoelectric layer 24 may be made of any kind of piezoelectric material, such as AlN, $LiNbO_3$ or $LiTaO_3$ film. Besides, the piezoelectric layer 24 may have any thickness between 0.1 μm and 10 μm, depending on the application of the high frequency surface acoustic wave device. Finally, the input transformation unit 25 and the output transformation unit 26, which are formed in pairs on the surface of the piezoelectric layer 24, are made of aluminum, with their thickness between 0.1 μm and 5 μm.

Figure 3:
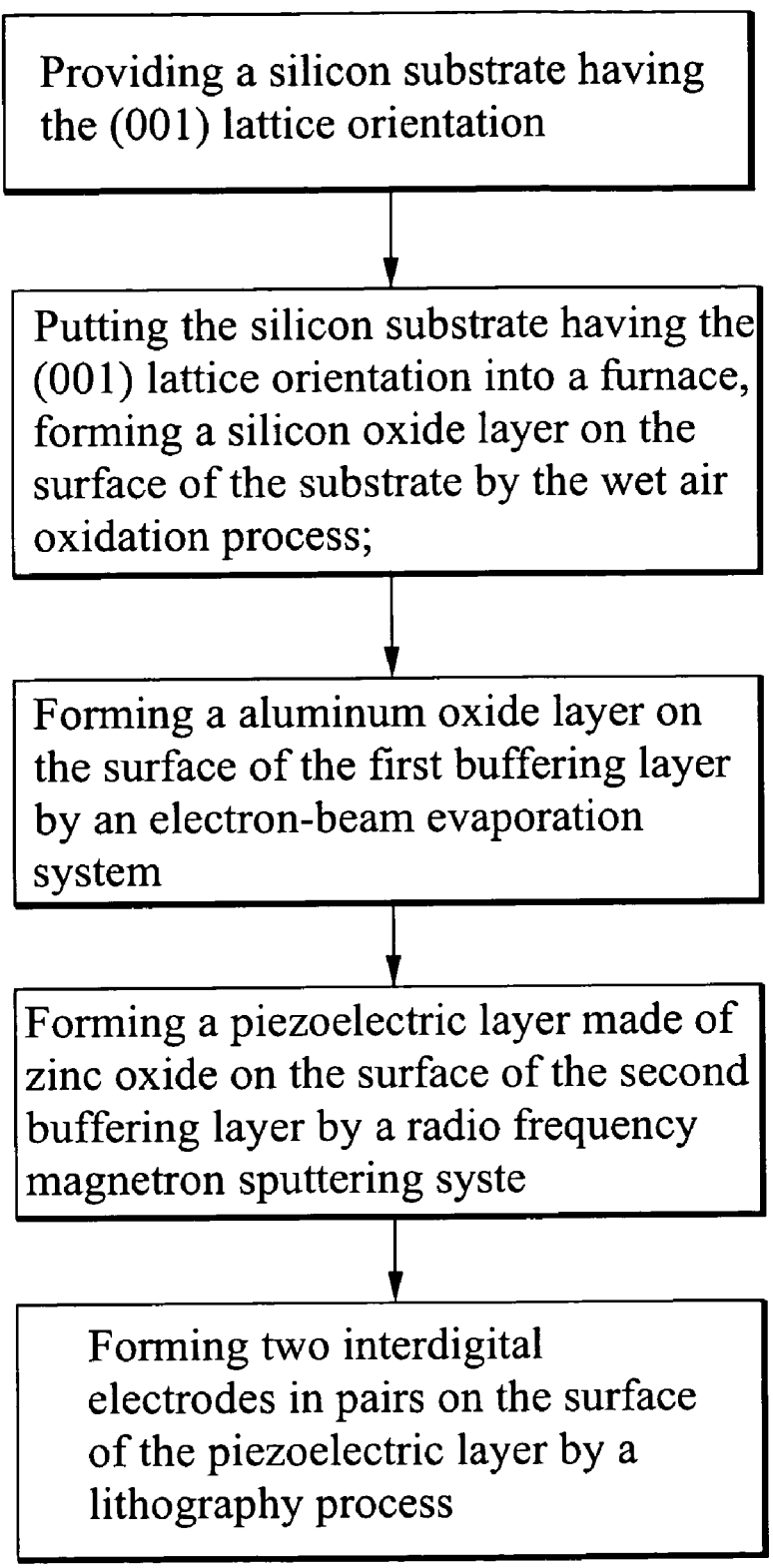
FIG. 3 is a flow chart showing the manufacturing process of the high frequency surface acoustic wave device according to one embodiment of the present invention.

FIG. 3 is a flow chart showing the manufacturing process of the high frequency surface acoustic wave device according to one embodiment of the present invention, wherein the high frequency surface acoustic wave device is shown in FIG. 2A and FIG. 2B. As shown in FIG. 3, the manufacturing process comprises the following steps:

(a) providing a silicon substrate having the (001) lattice orientation, as the substrate 21 shown in FIG. 2A;

(b) putting the silicon substrate having the (001) lattice orientation into a furnace, forming a silicon oxide layer on the surface of the substrate 21 by a wet air oxidation process, as the first buffering layer 22 shown in FIG. 2A;

(c) forming an aluminum oxide layer on the surface of the first buffering layer 22 by an electron-beam evaporation system (not shown in the figure), as the second buffering layer 23 shown in FIG. 2A;

(d) forming a piezoelectric layer made of ZnO on the surface of the second buffering layer 23 by a radio frequency magnetron sputtering system, as the piezoelectric layer 24 shown in FIG. 2A; and (e) forming two interdigital electrodes in pairs on the surface of the piezoelectric layer 24 by a lithography process, wherein an interdigital transducer is formed by these two interdigital electrodes, as the input transformation unit 25 and the output transformation unit 26 shown in FIG. 2A.

Hereinafter, the operation performance of the high frequency surface acoustic wave device will be described with reference to FIG. 4A, FIG. 4B, FIG. 5A and FIG. 5B. That is, the network spectrum response of the high frequency surface acoustic wave device of the present invention is competitive with that of the conventional high frequency surface acoustic wave device. Moreover, the phase velocity of the surface wave of the high frequency surface acoustic wave device of the present invention is also competitive with that of the conventional high frequency surface acoustic wave device.

Figure 4A:
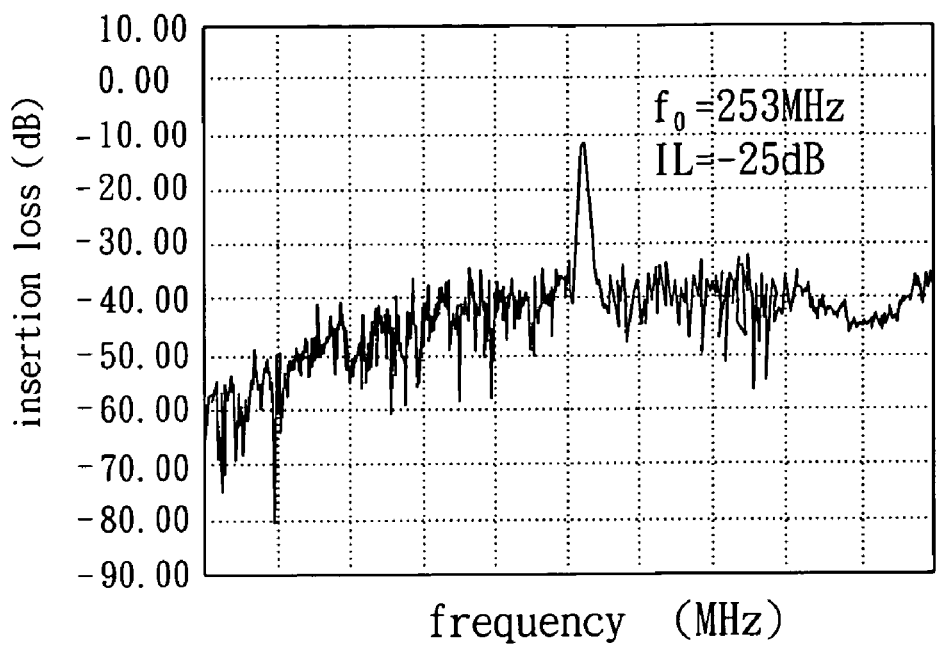
FIG. 4A is a schematic figure showing the network spectrum response of a conventional high frequency surface acoustic wave device.
Figure 4B:
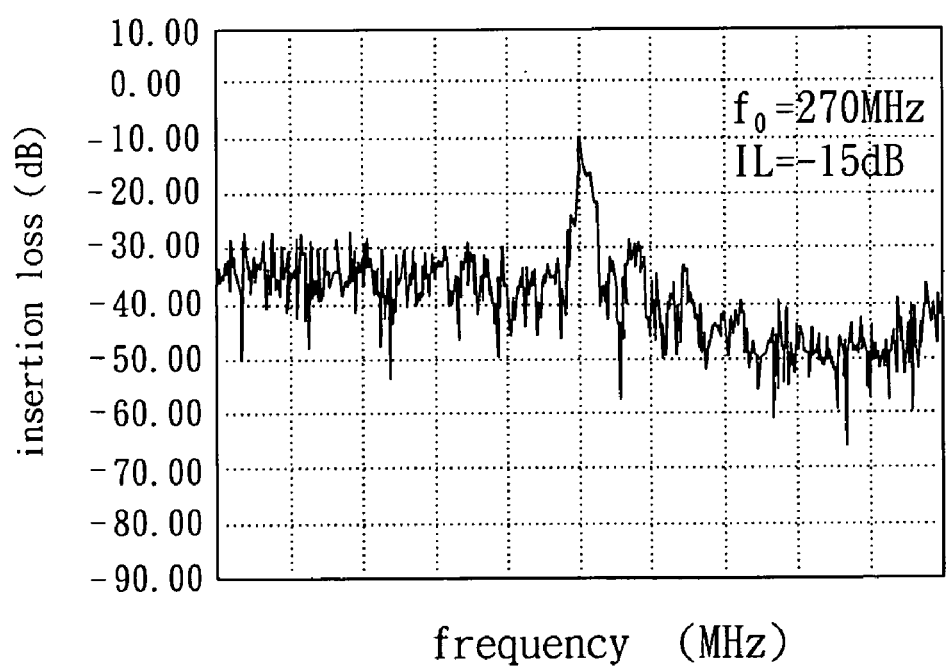
FIG. 4B is a schematic figure showing the network spectrum response of the high frequency surface acoustic wave device according to one embodiment of the present invention.
Figure 5A:
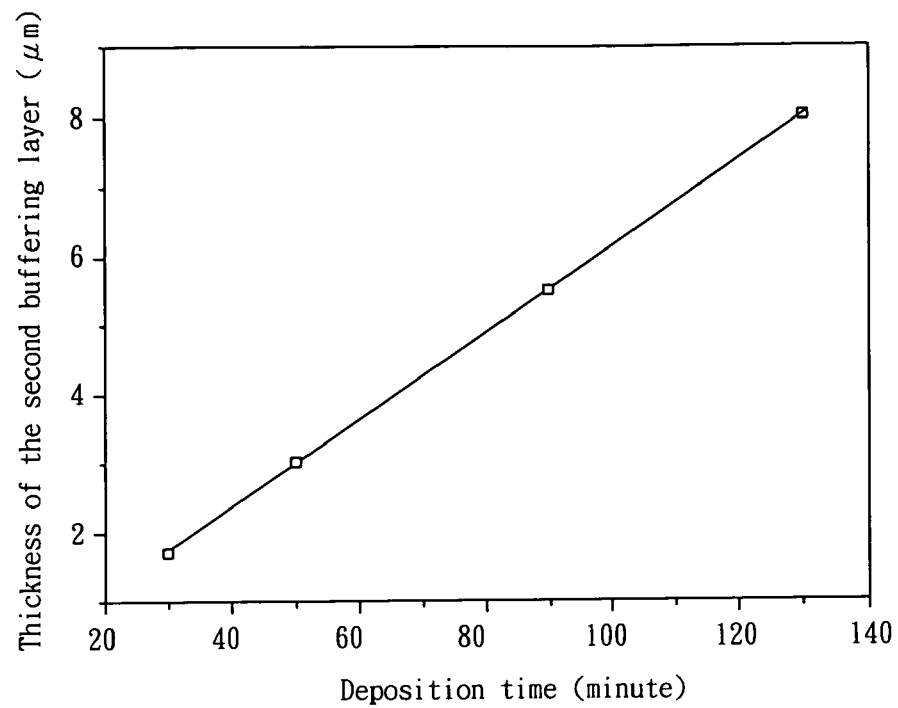
FIG. 5A is a schematic figure showing the relation between the thickness of the second buffering layer (i.e. the aluminum oxide layer) and the deposition time of the second buffering layer during the manufacturing process of the high frequency surface acoustic wave device according to one embodiment of the present invention.
Figure 5B:
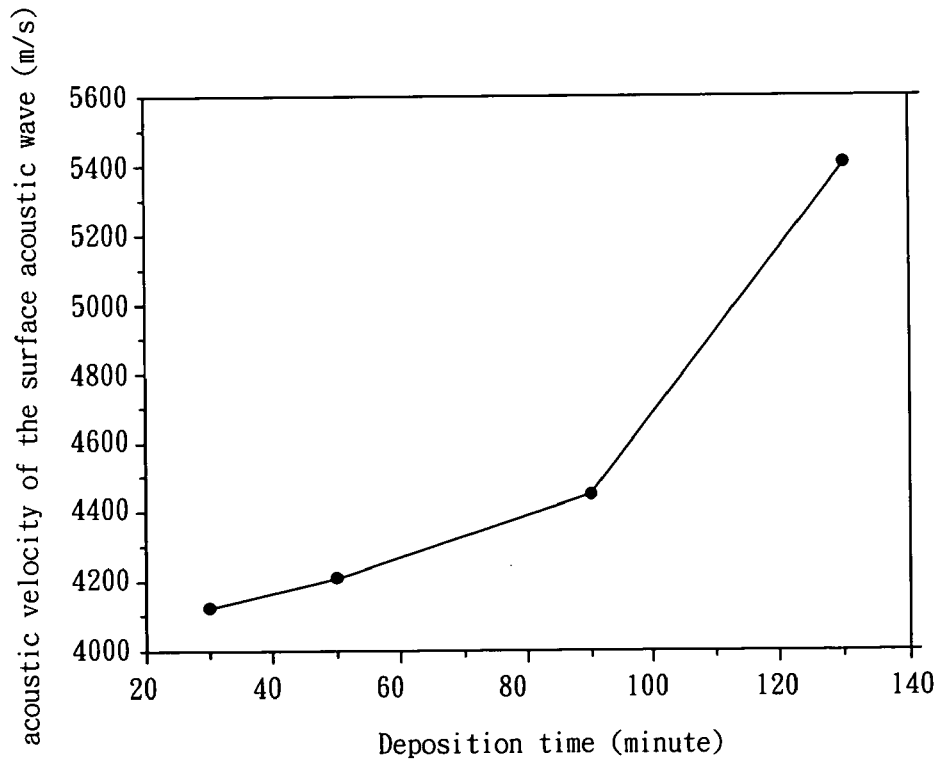
FIG. 5B is a schematic figure showing the relation between the acoustic velocity of the surface acoustic wave and the deposition time of the second buffering layer (i.e. the aluminum oxide layer).

FIG. 4A is a schematic figure showing the network spectrum response of a conventional high frequency surface acoustic wave device; and FIG. 4B is a schematic figure showing the network spectrum response of the high frequency surface acoustic wave device according to one embodiment of the present invention. FIG. 5A is a schematic figure showing the relation between the thickness of the second buffering layer (i.e. the aluminum oxide layer) and the deposition time of the second buffering layer during the manufacturing process of the high frequency surface acoustic wave device according to one embodiment of the present invention. FIG. 5B is a schematic figure showing the relation between the acoustic velocity of the surface acoustic wave and the deposition time of the second buffering layer (i.e. the aluminum oxide layer).

First, as shown in FIG. 4A, when the conventional high frequency surface acoustic wave device is operating, the operation frequency ($f_o$) is 253 MHz, and the insertion loss is −25 dB. Besides, when the high frequency surface acoustic wave device according to one embodiment of the present invention is operating, the operation frequency ($f_o$) is 270 MHz, and the insertion loss is −15 dB. Therefore, the operation performance of the high frequency surface acoustic wave device according to one embodiment of the present invention is competitive with that of the conventional high frequency surface acoustic wave device, such as the operation frequency (f0). Moreover, some of the operation frequency of the high frequency surface acoustic wave device according to one embodiment of the present invention is better than that of the conventional high frequency surface acoustic wave device, such as the insertion loss.

Later, as shown in FIG. 5A and FIG. 5B, when the thickness of the second buffering layer (i.e. the aluminum oxide layer) is larger than a certain value, such as 8 μm, the acoustic velocity of the surface acoustic wave of the high frequency surface acoustic wave device according to one embodiment of the present invention is equal to that of the conventional frequency surface acoustic wave device, which has a sapphire substrate. In other words, once the thickness of the second buffering layer (i.e. the aluminum oxide layer) is larger than a certain value, such as 8 μm, the operation performance of the high frequency surface acoustic wave device according to one embodiment of the present invention (for example, the network spectrum response and the acoustic velocity of the surface acoustic wave) is equal to those of the conventional frequency surface acoustic wave device. As a result, without using the expensive sapphire substrate as its substrate, the high frequency surface acoustic wave device according to one embodiment of the present invention can still have equal or better operation performance than the conventional high frequency surface acoustic wave device. Therefore, the manufacturing cost of the high frequency surface acoustic wave device according to one embodiment of the present invention can be lowered dramatically.

Figure 6A:
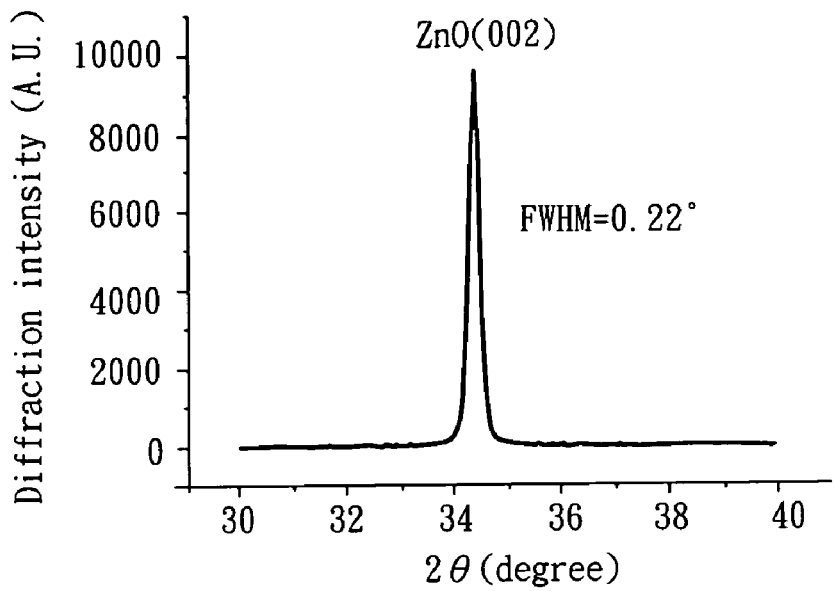
FIG. 6A is a schematic figure showing the X-ray diffraction pattern of the substrate of the conventional high frequency surface acoustic wave device.
Figure 6B:
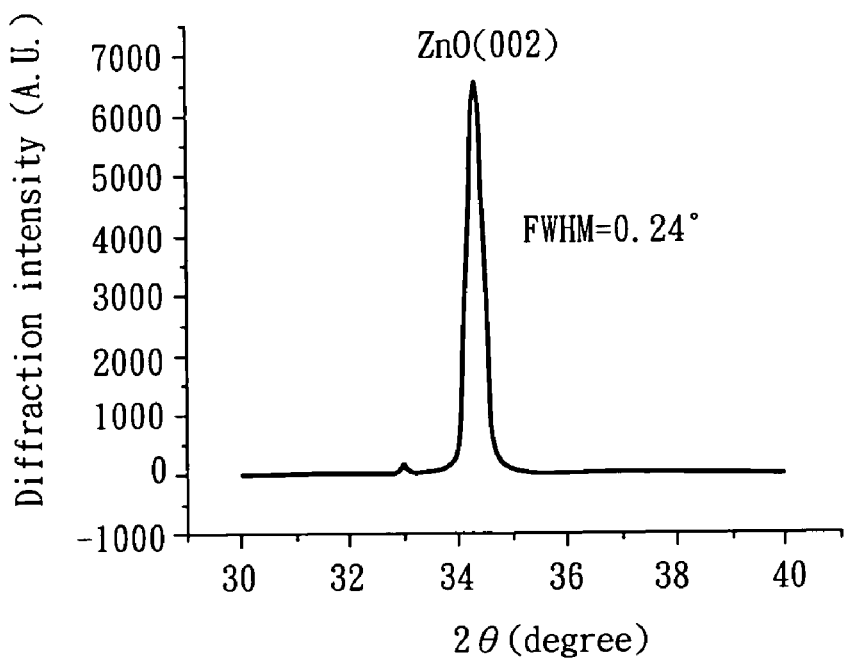
FIG. 6B is a schematic figure showing the X-ray diffraction pattern of the substrate of the high frequency surface acoustic wave device according to one embodiment of the present invention.

Hereinafter, with reference to FIG. 6A and FIG. 6B, the structure of the high frequency surface acoustic wave device according to one embodiment of the present invention is proved to be similar to that of the conventional high frequency surface acoustic wave device. FIG. 6A is a schematic figure showing the X-ray diffraction pattern of the substrate of the conventional high frequency surface acoustic wave device. FIG. 6B is a schematic figure showing the X-ray diffraction pattern of the substrate of the high frequency surface acoustic wave device according to one embodiment of the present invention.

As shown in FIG. 6A and FIG. 6B, the peaks of the two diffraction patterns are positioned at almost the same value (i.e. around 2 θ=34.4°). Besides, the full-width at half maximum (FWHM) of the two peaks is close to each other (i.e. 0.24° v.s. 0.22°). Therefore, the structure of the substrate of the high frequency surface acoustic wave device according to one embodiment of the present invention (i.e. the lattice orientation) is similar to that of the substrate of the conventional high frequency surface acoustic wave device, which is a sapphire substrate. As a result, the substrate of the high frequency surface acoustic wave device according to one embodiment of the present invention can replace the expensive sapphire substrate as the substrate of a high frequency surface acoustic wave device.

As described above, by forming a first buffering layer (i.e. the silicon oxide layer) and a second buffering layer (i.e. the $Al_2O_3$ layer) sequentially on the surface of the silicon substrate, and then forming a piezoelectric layer on the second buffering layer (i.e. the $Al_2O_3$ layer), the substrate of the high frequency surface acoustic wave device of the present invention can have the structure similar to that of the substrate of the conventional high frequency surface acoustic wave device. Besides, the operation performance of the high frequency surface acoustic wave device of the present invention (for example, the network spectrum response and the acoustic velocity of the surface acoustic wave) is equal to that of the conventional frequency surface acoustic wave device. As a result, without using the expensive sapphire substrate as its substrate, the high frequency surface acoustic wave device of the present invention can still have equal or better operation performance than the conventional high frequency surface acoustic wave device. Therefore, the manufacturing cost of the high frequency surface acoustic wave device of the present invention can be lowered dramatically.

Although the present invention has been explained in relation to its preferred embodiment, it is to be understood that many other possible modifications and variations can be made without departing from the scope of the invention as hereinafter claimed.

What is claimed is:

1. A high frequency surface acoustic wave device comprising:
   a substrate;
   a first buffering layer on the surface of the substrate;
   a second buffering layer on the surface of the first buffering layer;
   a piezoelectric layer on the surface of the second buffering layer;
   an input transformation unit; and
   an output transformation unit;
   wherein the input transformation unit and the output transformation unit are formed in pairs on the surface of or beneath the piezoelectric layer, the second buffering layer is made of aluminum oxide, and the piezoelectric layer is made of ZnO, AlN, $LiNbO_3$ or $LiTaO_3$ film.

2. The high frequency surface acoustic wave device as claimed in claim 1, wherein the substrate is made of silicon.

3. The high frequency surface acoustic wave device as claimed in claim 1, wherein the first buffering layer is made of silicon oxide.

4. The high frequency surface acoustic wave device as claimed in claim 1, wherein the thickness of the first buffering layer is between 0.05 μm and 0.2 μm.

5. The high frequency surface acoustic wave device as claimed in claim 1, wherein the thickness of the second buffering layer is between 0.5 μm and 20 μm.

6. The high frequency surface acoustic wave device as claimed in claim 1, wherein the second buffering layer is formed on the surface of the first buffering layer by an electron-beam evaporation process.

7. The high frequency surface acoustic wave device as claimed in claim 1, wherein the input transformation unit and the output transformation unit are an interdigital electrode, respectively.

8. The high frequency surface acoustic wave device as claimed in claim 1, wherein the input transformation unit and the output transformation unit are made of aluminum.

9. The high frequency surface acoustic wave device as claimed in claim 1, wherein the piezoelectric layer is made of $Al_2O_3$ and has a thickness of 1.2 μm.

10. The high frequency surface acoustic wave device as claimed in claim 8, wherein the input transformation unit and the output transformation unit are made of aluminum and have a thickness between 0.1 μm and 5 μm.

* * * * *